(12) United States Patent
Djallal et al.

(10) Patent No.: US 12,162,328 B2
(45) Date of Patent: Dec. 10, 2024

(54) TEMPERATURE CONTROL DEVICE, IN PARTICULAR COOLING DEVICE FOR A MOTOR VEHICLE

(71) Applicant: Valeo Systemes Thermiques, Le Mesnil Saint-Denis (FR)

(72) Inventors: Fethy Djallal, La Suze sur Sarthe (FR); Julien Veron, La Suze sur Sarthe (FR); Aurélie Bellenfant, La Suze sur Sarthe (FR); Marc Herry, La Suze sur Sarthe (FR)

(73) Assignee: VALEO SYSTEMES THERMIQUES, Le Mesnil Saint-Denis (FR)

( * ) Notice: Subject to any disclaimer, the term of this patent is extended or adjusted under 35 U.S.C. 154(b) by 625 days.

(21) Appl. No.: 17/435,281

(22) PCT Filed: Mar. 2, 2020

(86) PCT No.: PCT/FR2020/050417
§ 371 (c)(1),
(2) Date: Aug. 31, 2021

(87) PCT Pub. No.: WO2020/178519
PCT Pub. Date: Sep. 10, 2020

(65) Prior Publication Data
US 2022/0153085 A1     May 19, 2022

(30) Foreign Application Priority Data
Mar. 1, 2019  (FR) ........................................ 1902122

(51) Int. Cl.
*F28D 1/03*     (2006.01)
*B60H 1/00*     (2006.01)
(Continued)

(52) U.S. Cl.
CPC ......... *B60H 1/00278* (2013.01); *F28D 1/035* (2013.01); *F28F 9/0253* (2013.01);
(Continued)

(58) Field of Classification Search
None
See application file for complete search history.

(56) References Cited

U.S. PATENT DOCUMENTS 5,477,919 A * 12/1995 Karube ................. F28F 9/0212
165/178
5,632,161 A *  5/1997 Shimoya ................. F25B 40/00
62/515
(Continued)

FOREIGN PATENT DOCUMENTS

CN     103090597 A  *  5/2013  ......... F28D 1/05391
CN     104101251 A  * 10/2014  ........... F28D 9/0043
(Continued)

OTHER PUBLICATIONS

International Search Report and Written Opinion issued in corresponding International Patent Application No. PCT/FR2020/050417, mailed on Jul. 15, 2020 (10 pages).
(Continued)

*Primary Examiner* — Jenna M Maroney
(74) *Attorney, Agent, or Firm* — Osha Bergman Watanabe & Burton LLP

(57) ABSTRACT

A temperature regulation device includes an upper plate and lower plate assembled together to form multiple circulation channels for a heat-transfer fluid to circulate in. The multiple circulation channels are grouped together in groups of channels running parallel to one another with a spacing between the channels referred to as an intra-group spacing. Two groups of channels with the same direction of circulation are separated from each other by an intermediate group
(Continued)

Figure 1:
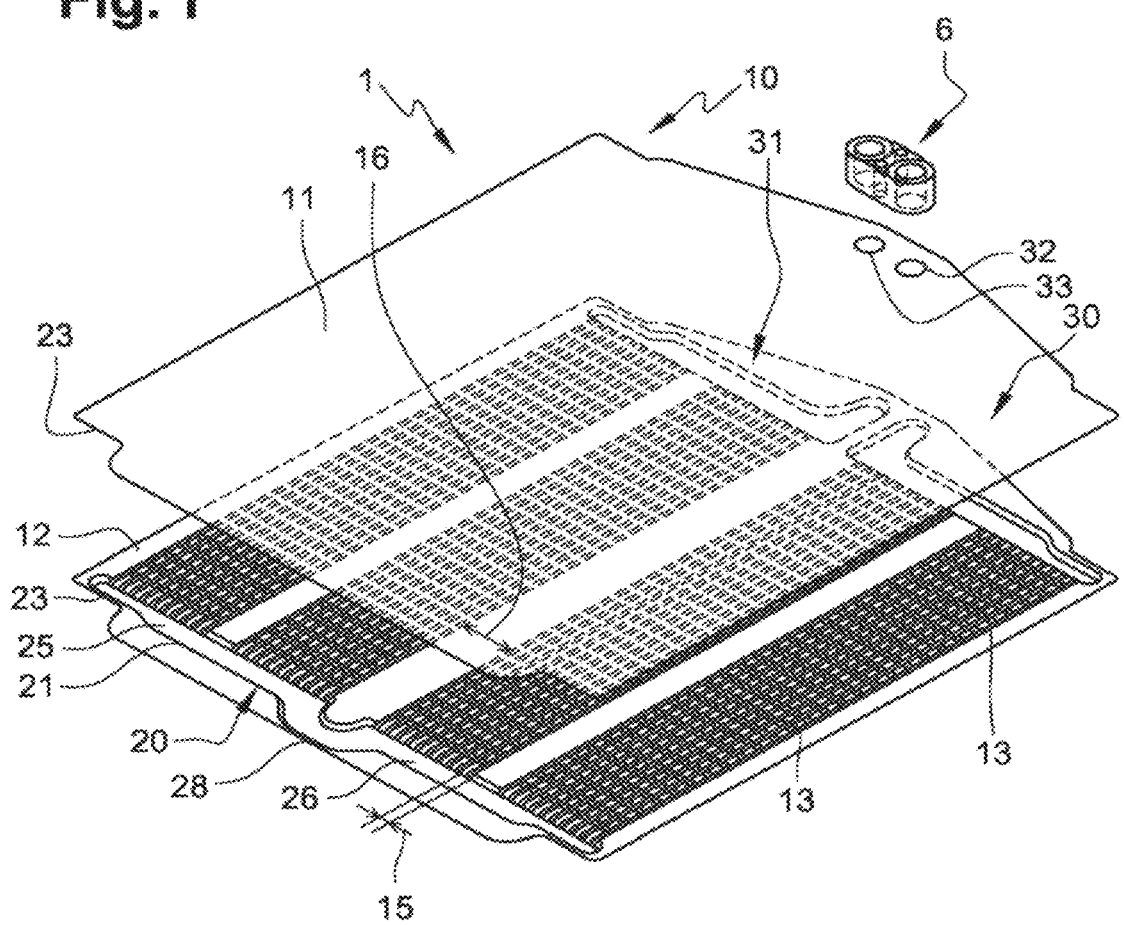

of channels with an opposite circulation direction. The device also includes a connector assembled on the upper or lower plate that creates a fluid path for connecting two outlet collecting zones. The connector includes an external fluid inlet orifice and an external fluid outlet orifice.

8 Claims, 5 Drawing Sheets

(51) Int. Cl.
    *F28F 9/02*     (2006.01)
    *H01L 23/473*     (2006.01)
    *H01M 10/613*     (2014.01)
    *H01M 10/6556*     (2014.01)

(52) U.S. Cl.
    CPC ........ *H01L 23/473* (2013.01); *H01M 10/613* (2015.04); *H01M 10/6556* (2015.04); *B60H 2001/00307* (2013.01); *B60H 2001/00928* (2013.01)

(56) References Cited

U.S. PATENT DOCUMENTS

| | | | | |
|---|---|---|---|---|
| 6,443,223 | B2 * | 9/2002 | Ichiyanagi | F28F 9/0256 |
| | | | | 165/178 |
| 6,443,224 | B2 * | 9/2002 | Sasaki | F28F 9/0246 |
| | | | | 165/178 |
| 7,604,258 | B2 * | 10/2009 | Getto | F28F 9/0258 |
| | | | | 285/137.11 |
| 7,926,854 | B2 * | 4/2011 | Sharma | F28F 9/0253 |
| | | | | 165/178 |
| 8,403,030 | B2 * | 3/2013 | Payne | F28F 3/06 |
| | | | | 165/185 |
| 9,618,283 | B2 * | 4/2017 | Kalbacher | F28F 9/04 |
| 9,711,829 | B2 * | 7/2017 | Haussmann | F28F 9/02 |
| 10,837,719 | B2 * | 11/2020 | Franz | F16L 41/03 |
| 11,028,947 | B2 * | 6/2021 | Srinivasan | F16L 13/08 |
| 2007/0241560 | A1 * | 10/2007 | Malone | F16L 9/19 |
| | | | | 285/123.3 |
| 2008/0129043 | A1 * | 6/2008 | Holt | F28F 9/0253 |
| | | | | 285/212 |
| 2008/0202730 | A1 * | 8/2008 | Onishi | G06F 1/203 |
| | | | | 257/E23.098 |
| 2009/0140515 | A1 * | 6/2009 | Ichimura | F16L 41/086 |
| | | | | 285/124.5 |
| 2013/0183555 | A1 * | 7/2013 | Boddakayala | H01M 10/625 |
| | | | | 29/890.03 |
| 2013/0189557 | A1 * | 7/2013 | Haussmann | H01M 10/6569 |
| | | | | 165/104.11 |
| 2015/0144314 | A1 | 5/2015 | Srinivassan et al. | |
| 2016/0033211 | A1 * | 2/2016 | Choi | F01M 5/007 |
| | | | | 29/890.03 |
| 2016/0172726 | A1 | 6/2016 | Enning et al. | |
| 2016/0204486 | A1 * | 7/2016 | Kenney | F28F 3/12 |
| | | | | 29/890.03 |
| 2016/0315365 | A1 * | 10/2016 | Vanderwees | H01M 10/6557 |
| 2016/0356558 | A1 * | 12/2016 | Franz | H05K 7/20272 |
| 2018/0205125 | A1 * | 7/2018 | Burgers | F28F 9/0204 |
| 2022/0153085 | A1 * | 5/2022 | Djallal | H01M 10/613 |
| 2022/0196347 | A1 * | 6/2022 | Djallal | F28D 1/035 |

FOREIGN PATENT DOCUMENTS

| | | | | |
|---|---|---|---|---|
| CN | 105408149 A | | 3/2016 | |
| CN | 107112612 A | * | 8/2017 | ............. B23P 15/26 |
| CN | 116666835 A | * | 8/2023 | |
| DE | 69815593 T2 | * | 5/2004 | |
| DE | 102004046361 A1 | * | 4/2006 | ............. F28F 9/0246 |
| DE | 102004046361 B4 | * | 7/2006 | ............. F28F 9/0246 |
| DE | 102008059955 A1 | | 6/2010 | |
| DE | 202017107884 U1 | * | 5/2019 | |
| EP | 1701110 A2 | * | 9/2006 | ......... F24D 19/0002 |
| EP | 2828922 B1 | | 10/2017 | |
| FR | 3085543 A1 | * | 3/2020 | |
| FR | 3086048 A1 | * | 3/2020 | ............ F28D 1/0341 |
| JP | 2001133191 A | * | 5/2001 | ............. F28F 9/0246 |
| KR | 100727821 B1 | * | 6/2007 | |
| KR | 20170132212 A | * | 12/2017 | |
| KR | 20180116869 A | * | 10/2018 | |
| KR | 20200041007 A | * | 4/2020 | |
| WO | WO-2015032988 A1 | * | 3/2015 | ............. F25B 39/00 |
| WO | WO-2016097134 A1 | * | 6/2016 | ............. F25B 39/02 |
| WO | WO-2019062590 A1 | * | 4/2019 | .......... H01M 10/613 |
| WO | WO-2019085868 A1 | * | 5/2019 | ............. F25B 39/02 |
| WO | WO-2019175576 A1 | * | 9/2019 | ............. F25D 17/02 |
| WO | WO-2020043960 A1 | * | 3/2020 | |
| WO | WO-2020178519 A1 | * | 9/2020 | ......... B60H 1/00278 |
| WO | WO-2020178536 A1 | * | 9/2020 | |
| WO | WO-2020212457 A1 | * | 10/2020 | ............. F28D 1/035 |

OTHER PUBLICATIONS

Office Action issued in counterpart Chinese Application No. 202080030035.3, dated Jul. 14, 2023 (7 pages).

* cited by examiner

TEMPERATURE CONTROL DEVICE, IN PARTICULAR COOLING DEVICE FOR A MOTOR VEHICLE

The present invention relates to a temperature regulation device, notably a cooling device, notably for an electrical component liable to give off heat during its operation, notably to a device for cooling at least one battery or battery cells of a motor vehicle.

Vehicle batteries, in particular for electric vehicles or hybrid vehicles, should as much as possible be maintained at the desired temperature, which is why so-called vehicle battery cooling devices are used. These cooling devices may comprise cooling plates through which a cooling liquid circulates. The cooling plates are installed, as far as possible without gaps, on the outer side of the batteries in order to dissipate heat or else to heat the battery. Cooling devices are known in which the cooling plate is made up of two plate parts which are normally directly fastened to each other. Here, the first plate part is preferably flat, and the second plate part is preferably a stamped or deformed sheet of metal which has meandering depressions. Said depressions are closed by the flat plate part which is fixed to the stamped plate part, so that refrigerant conduits are formed. Patent EP 2 828 922 B1 describes such a device.

Mention may also be made of patent application US2015144314 which describes a battery cooling device with a fluid connection flange.

The invention aims to improve this type of device.

The invention thus proposes a temperature regulation device, notably a cooling device, for an electrical component liable to give off heat during its operation, notably for an electrical energy storage module, this device comprising an upper plate and a lower plate assembled with the upper plate to form together a plurality of circulation channels for a heat-transfer fluid, notably a refrigerant fluid, notably a fluid selected from the following refrigerant fluids R134a, R1234yf or R744, in which device the channels are grouped together in groups of channels, the channels of a group running substantially parallel to one another with a predetermined spacing between neighboring channels referred to as the intra-group spacing, two groups of channels that have the same direction of circulation of fluid being separated from one another by at least one group of channels that have an opposite direction of circulation of fluid, the device comprising a connector assembled on the upper or lower plate, and designed to create a fluid path for connecting two collecting zones, notably outlet collecting zones, of two groups of channels having notably the same direction of circulation, these collecting zones being formed between the two, lower and upper, plates, this connector comprising an external fluid inlet orifice and an external fluid outlet orifice, one of these two external orifices being in fluidic communication with the fluid path of the connector and the other of the external orifices being in fluidic communication with a fluid collecting zone of an intermediate group of channels which is situated between the two groups of channels which are connected to one another by the fluid path in the connector, this intermediate group notably having a direction of circulation that is the opposite direction to the other two groups, it being possible for the group or groups of channels to be reduced in number to just one channel if appropriate.

The invention notably permits, for a reduced packaging and a minimum number of components, using a fluid inlet/outlet connection, the removal of the fluid from or the supply of the fluid to two nonadjacent zones of the circuit of the temperature regulation device, which notably defines a heat exchanger, and the supply and, respectively the removal from a zone of the exchanger circuit that is situated between these two adjacent zones.

The invention also permits, for example in the context of a brazed heat exchanger comprising an upper plate, a lower plate, and fluid channels between the two plates, the transfer of the fluid via the joining duct from one fluid zone of the exchanger to another, nonadjacent, fluid zone of this exchanger. This duct may be tubular in shape, being for example a tube of oval or round cross section or of rectangular or square cross section, this tube being arranged in such a way as to connect the two nonadjacent zones to which fluid is to be supplied or from which fluid is to be removed.

The invention notably permits the creation of a plate-type cooling heat exchanger for batteries. This exchanger preferably forms part of a refrigerant or liquid circuit.

The invention notably permits the creation of a circuit of a plate-type device intended to meet the requirements of temperature uniformity in a battery module and between the modules in which it is necessary, using a fluid inlet/outlet connection, to remove this fluid from or supply this fluid to two nonadjacent zones of the circuit of the exchanger and to supply fluid to or respectively remove fluid from a zone situated between these two nonadjacent zones.

The invention, by providing the fluid pathway between two internal orifices, this path acting as a fluid junction bridging between two zones, permits the use of just one connector, or flange, rather than two simple flanges.

According to one aspect of the invention, the connector comprises two internal orifices onto which the fluid path of the connector opens, which path furthermore communicates with one of the external orifices, these internal orifices being positioned respectively facing two holes in the plate which holes preferably open onto the associated collecting zones, and the connector comprises a third internal orifice which communicates with the other of the external orifices via a channel in the connector, which channel is notably cylindrical in shape, this third internal orifice being preferably positioned facing a hole in the plate which opens onto the collecting zone of the intermediate group of channels. In one example of the invention, the connector thus comprises 5 orifices in total.

According to one aspect of the invention, the internal orifices are on the one same face of the connector, which face comes into contact with the plate, and the external orifices are notably on an opposite face of the connector, notably so as to allow external pipes, one supplying and the other removing fluid, to be connected to these external orifices.

According to one aspect of the invention, the fluid path comprises a main portion perpendicular to the channel opening onto the third internal orifice, this portion and this channel being separated from one another.

According to one of the aspects of the invention, the fluid path is formed by a slot made on a body of the connector and closed by a cover fixed in a fluidtight manner onto the body, this cover being notably of elongate shape.

According to one of the aspects of the invention, the cover comprises a plate designed to be housed at least partially in the slot, this cover being for example welded to the body.

According to one of the aspects of the invention, the cover comprises a tab, notably of rectangular shape, be housed in a cutout of a shape complementing the tab.

As a preference, the cover comprises two fixing lugs designed to come to bear notably against two lateral faces of the body, and these lugs are notably punched onto the body.

According to one of the aspects of the invention, the body of the connector is made notably of aluminum, notably by casting and machining, and the cover is made preferably of aluminum.

According to one of the aspects of the invention, the upper plate has three holes, two of the holes being associated with groups of channels with the same direction of circulation and an intermediate hole, between these two holes, which is associated with a group of fluid channels with the opposite direction, these three holes being notably aligned.

Another subject of the invention is a system comprising an electrical component liable to give off heat during its operation, notably for an electrical energy storage module, and a cooling device described above, arranged to cool the component, this component or battery being in thermal contact with the upper plate of the cooling device.

Figure 2:
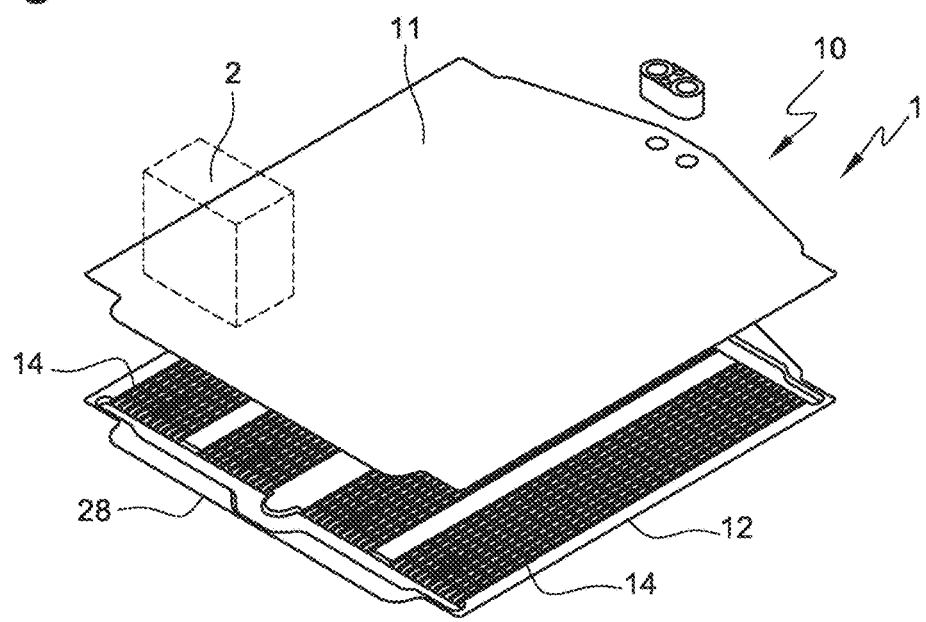
Figure 3:
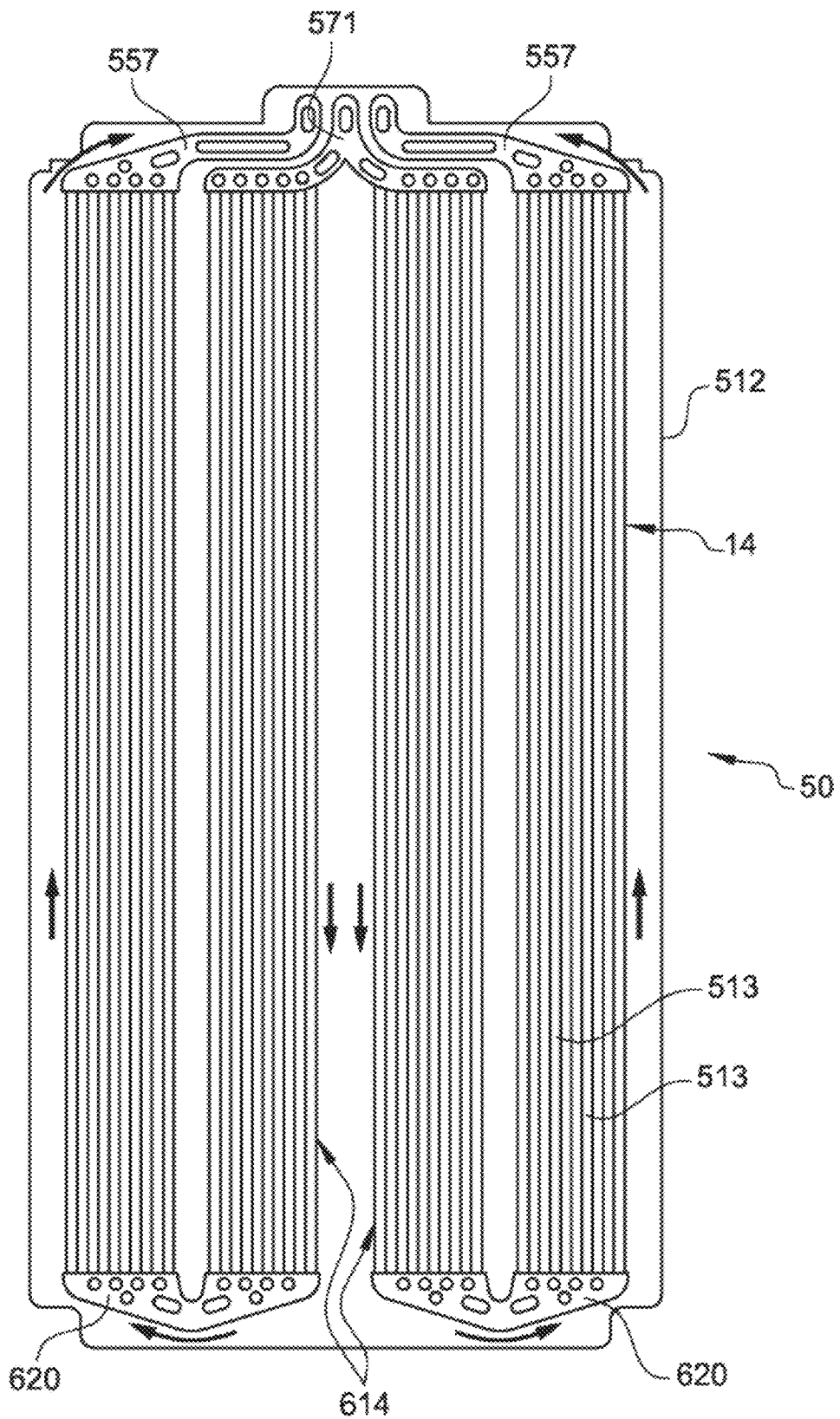
Figure 4:
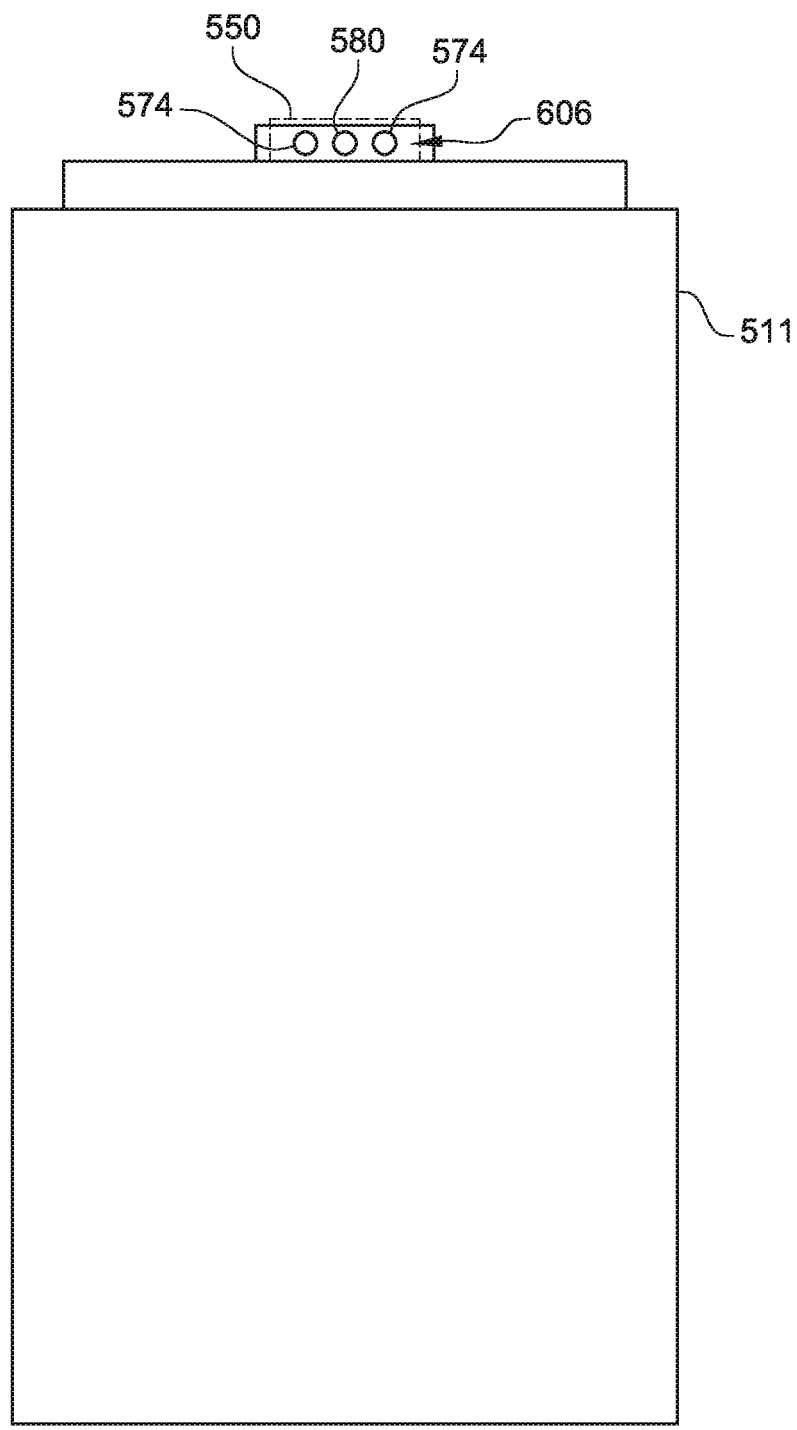
Figure 5:
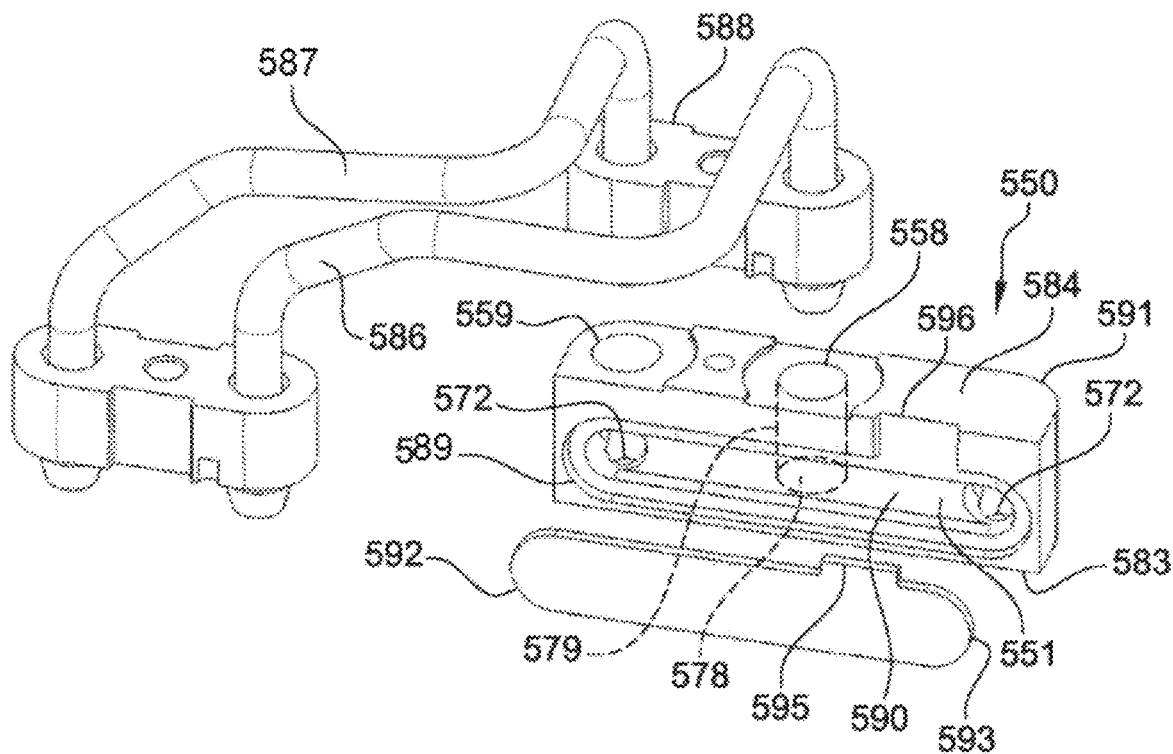
Figure 6:
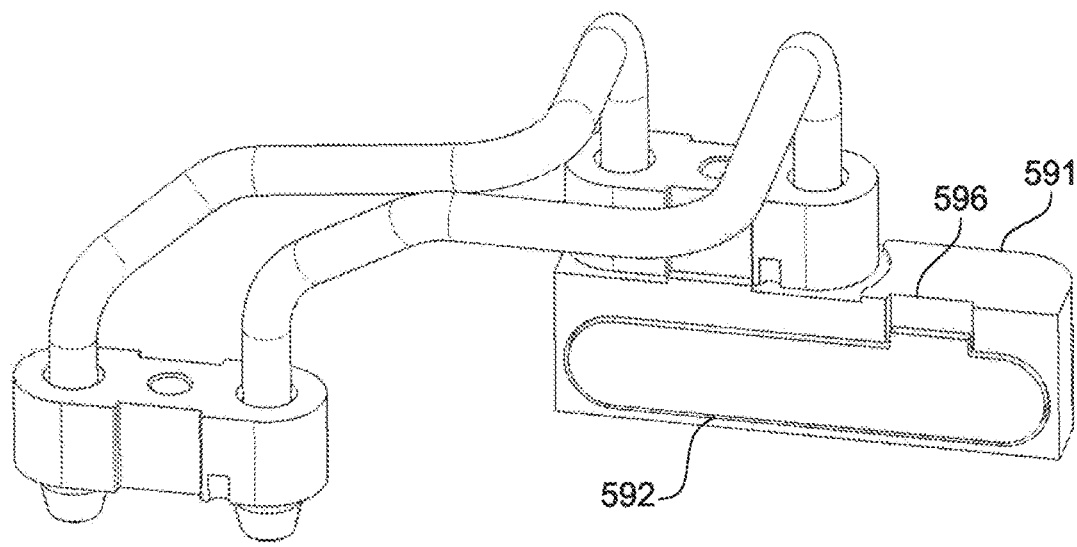
Figure 7:
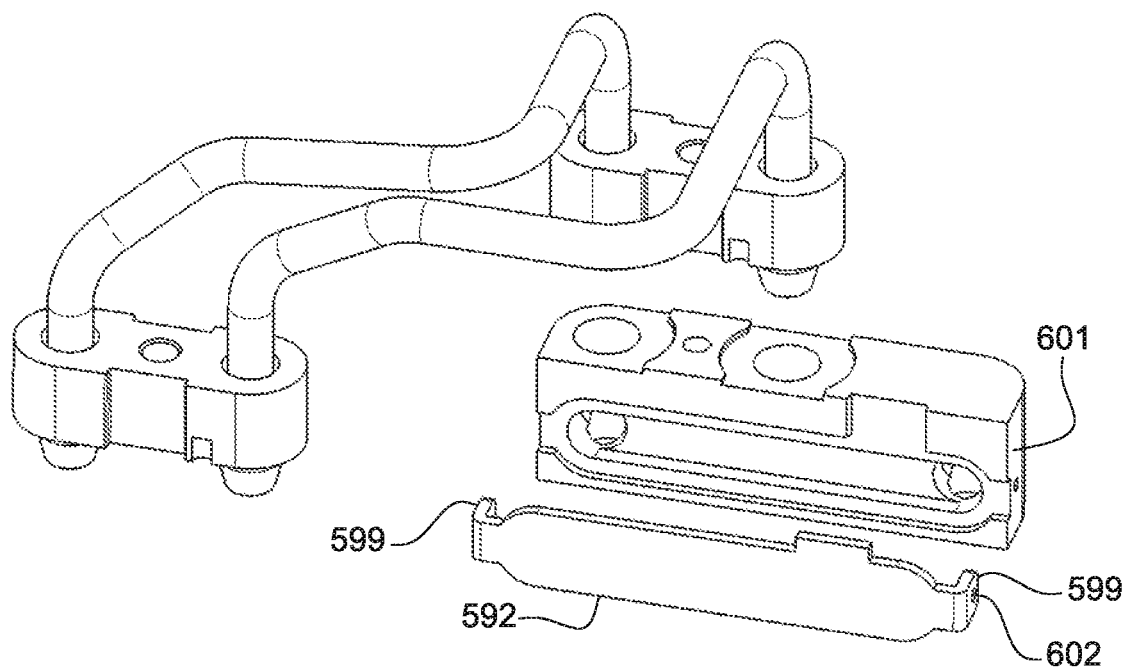
Figure 8:
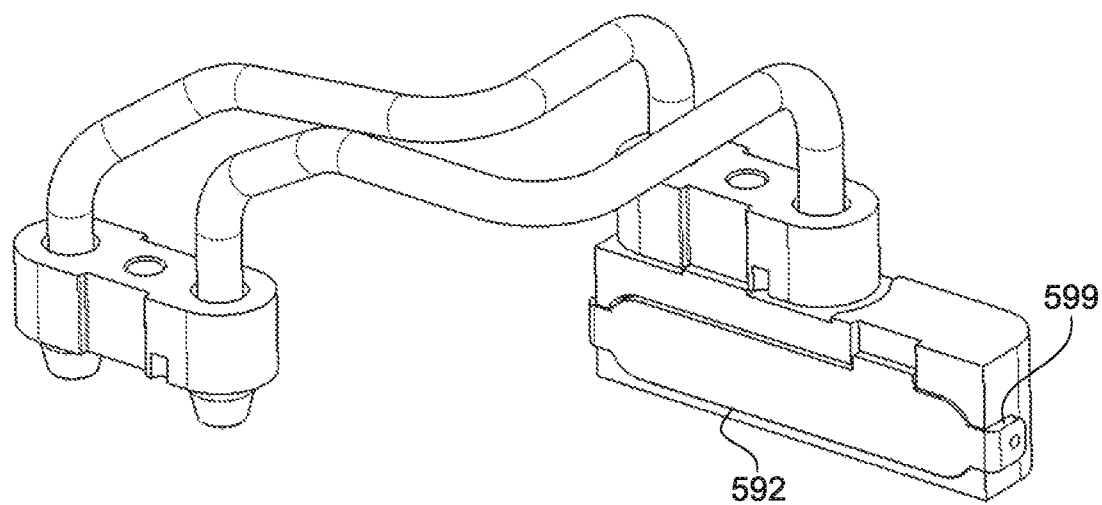

Other features and advantages of the invention will become more clearly apparent from reading the following description, which is given by way of illustrative and non-limiting example, and the appended drawings, in which:

FIG. 1 schematically and partially illustrates a device according to one example of the invention;

FIG. 2 schematically and partially illustrates the device of FIG. 1 in a different view;

FIG. 3 schematically and partially illustrates a device according to another example of the invention;

FIG. 4 schematically and partially illustrates the device of FIG. 3 in a different view;

FIG. 5 schematically and partially illustrates a connector of a device according to one example of the invention;

FIG. 6 schematically and partially illustrates the connector of FIG. 5 in a different view;

FIG. 7 schematically and partially illustrates a connector according to another example of the invention;

FIG. 8 schematically and partially illustrates the connector of FIG. 7 in a different view.

FIGS. 1 and 2 depict a system 1 comprising a set of battery cells 2 to be cooled, for example rowed in two or more rows, and a cooling device 10 arranged to cool the cells 2, which are in thermal contact with an upper plate of the cooling device 10, as explained below.

The temperature regulation device 10 comprises an upper plate 11, a lower plate 12 assembled with the upper plate 11 so as to form together a plurality of circulation channels 13 for a heat-transfer fluid, in particular a refrigerant fluid, notably a fluid chosen from the following refrigerant fluids R134a, R1234yf or R744. The channels 13 are grouped together in groups 14 of channels, the channels of a group running substantially parallel to one another with a predetermined spacing between neighboring channels, called the intra-group spacing 15, the intra-group spacing being strictly less than the spacing between two groups of neighboring channels, called the intergroup spacing 16. The channels 13 each have a cross section of between 1 mm$^2$ and 9 mm$^2$. The channels 13 all have the same cross section and are rectilinear. The channels 13 extend substantially over the entire length of the plates. The groups 14 of channels are arranged side by side and have the same length. The intra-group spacing 15 between the different channels 13 of the same group of channels is constant, in the example considered. The intergroup spacing 16 between the different groups of channels is constant, in the example considered. The cooling device comprises a diverting chamber 20 arranged to conduct the fluid leaving one of the groups 14 of channels toward one of the other groups of channels. All the channels 13 of the group open onto this diverting chamber. The diverting chamber 20 is formed by the upper 11 and lower 12 plates, for example made of aluminum. The lower plate 12 comprises a stamped zone 21 arranged to participate in the formation of the diverting chamber 20. The stamped zone 21 is closed with the other of the plates 11, which is flat, to form the diverting chamber 20. The diverting chamber 20 extends over one side 23 of the plates. The device has four groups 14 of channels. The number of groups of channels dedicated to the circulation of refrigerant fluid in one direction is equal to the number of groups of channels dedicated to the circulation of fluid in the opposite direction. Two groups 14 of channels with the same direction of fluid circulation open onto the diverting chamber. These two groups of channels are neighbors on one half of the plates. The diverting chamber 20 is fluidically connected to two other groups 14 of channels which are arranged to receive the refrigerant fluid leaving the diverting chamber. These two groups of channels are neighbors on the other half of the plates. Thus, four groups of channels are connected to the common diverting chamber 20. The two groups 14 of inlet channels arriving at the diverting chamber 20 are arranged on one branch 25 of the diverting chamber, and the two groups of outlet channels leaving the diverting chamber are arranged on another branch 26 of the diverting chamber. The direction of circulation of the fluids is indicated by arrows. These branches 25 and 26 of the diverting chamber 20 are substantially rectilinear, and perpendicular to the channels. An elbow 28 is arranged to connect the two branches 25 and 26 of the diverting chamber. The cooling device comprises an inlet zone 30 for the refrigerant fluid entering the channels, this inlet zone being formed between the two plates 11 and 12. This fluid inlet zone 30 is arranged to supply all the fluid circulation channels 13 which open onto the diverting chamber 20, namely the channels in which the fluid flows toward the diverting chamber. This inlet zone 30 is common to the groups 14 of channels. The cooling device comprises an outlet zone 31 for the refrigerant fluid leaving the channels, this outlet zone being formed between the two plates 11 and 12. This fluid outlet zone 31 is arranged to conduct the fluid leaving all the fluid circulation channels 13 which originate from the diverting chamber. This outlet zone 31 is common to the two groups of channels. The inlet 30 and outlet 31 zones are adjacent to an inlet 32 and outlet 33 orifice respectively. The inlet 32 and outlet 33 orifices are connected to a pipe connector block 6. The lower plate 2 comprises zones of rounded cross section, in particular stamped zones, to form the channels 13 with the upper plate. The inlet 30 and outlet 31 zones include stamped zones of the lower plate 12. Preferably, the heat-transfer fluid can be chosen from the refrigerant fluids with the designation R134a, R1234yf or R744. The heat-transfer fluid used is alternatively glycol water, without limitation on the glycol content (0% to 100%). The battery cells comprise, for example, a plurality of lithium-ion (Li-ion) batteries for use in a hybrid vehicle. In another embodiment, the plurality of battery cells are Li-ion batteries for use in a battery-powered electric vehicle. The diverting chamber 20 and/or the inlet zone 30 and/or the outlet zone 31 include(s), where appropriate, reinforcing elements to reinforce the mechanical strength in these zones, which are potentially of larger cross section.

FIGS. 3 and 4 depict another embodiment of the invention, namely a temperature regulating device 50, in this instance a cooling device, for an electrical energy storage module, this device comprising an upper plate 511 and a lower plate 512 assembled with the upper plate 511 so as to form together a plurality of circulation channels 513 for a heat-transfer fluid, in which device the channels are grouped together in groups 14 of channels, the channels of a group running substantially parallel to one another with a predetermined spacing between neighboring channels, two groups 14 of channels that have the same direction of circulation of fluid being separated from one another by two neighboring groups 614 of channels that have an opposite direction of circulation of fluid.

Diverting chambers 620 are provided, at one of the ends of the channels 13, to connect one of the groups of channels 14 to the neighboring group of channels 614 via a 180° diverting bend.

The device 50 comprising a connector 550 assembled on the upper plate 511, as illustrated in FIG. 4 and in FIG. 5 as well as in FIG. 6.

This connector 550 is designed to create a fluid path 551 for connecting two outlet collecting zones 557 of two groups of channels 14 having the same direction of circulation illustrated by arrows, these collecting zones 557 being formed between the two, lower 512 and upper 511, plates, this connector 550 comprising an external fluid inlet orifice 558 and an external fluid outlet orifice 559, the external outlet orifice 559 being in fluidic communication with the fluid path 551 of the connector and the other of the external orifices 558 being in fluidic communication with a fluid collecting zone 571 of the intermediate group 614 of channels which is situated between the two groups of channels 14 which are connected to one another by the fluid path 551 in the connector 50.

The connector 50 comprises two internal orifices 572 onto which the fluid path 551 of the connector opens, which path further communicates with the external orifice 559, these internal orifices 572 being positioned respectively facing two holes 574 in the plate 511, which holes open onto the associated collecting zones 557, and the connector 550 comprises a third internal orifice 578 which communicates with the other of the external orifices 558 via a straight cylindrical channel 579 in the connector, this third internal orifice 558 being positioned facing a hole 580 in the plate 511 which opens onto the collecting zone 571 of the intermediate group of channels. In one example of the invention, the connector 550 thus comprises five orifices in total, namely 558, 559, two of 572, and 578.

The internal orifices 572 and 578 are on the one same face 583 of the connector, which face comes into contact with the plate, and the external orifices 558 and 559 are on an opposite face 584 of the connector, so as to allow external pipes 586 and 587, one, 586, supplying and the other, 587, removing fluid, to be connected to these external orifices. These pipes are fixed to a common flange 588, and connected to a fluid circuit.

The fluid path 551 comprises a main portion 589 perpendicular to the channel 579 opening onto the third internal orifice 578, this straight portion 589 and this channel 579 being separated from one another.

The fluid path 551 is formed by a slot 590 cut into a body 591 of the connector and closed by a cover 592 fixed in a fluidtight manner to the body, this cover 592 being of elongate shape corresponding substantially to the mouth of the slot 590.

The cover 592 comprises a plate 593 designed to be housed at least partially in the slot 590, this cover 592 being, for example, welded to the body 591.

The cover 592 comprises a tab 595, of rectangular shape, be housed in a cutout 596 of a shape complementing the tab.

As a variant, as illustrated in FIG. 7 and in FIG. 8, the cover 592 comprises two lateral fixing lugs 599 designed to come to bear against two lateral faces 601 of the body. The cover 592 is held on the body by punching the lateral lugs 599 in the zones 602.

The body 591 of the connector is made notably of aluminum, notably by casting and machining, and the cover 592 is made of aluminum.

The upper plate 511 has three holes 574 and 580, two of the holes being associated with groups of channels with the same direction of circulation and an intermediate hole, between these two holes, which is associated with a group of fluid channels with the opposite direction, these three holes being notably aligned. These holes are, for example, on a narrowed region 606 of the plate 511.

The invention claimed is:

1. A temperature regulation device for an electrical component liable to give off heat during its operation, the temperature regulation device comprising:
    an upper plate and a lower plate assembled with the upper plate to form together a plurality of circulation channels for a heat-transfer fluid selected from the following refrigerant fluids R134a, R1234yf or R744,
    wherein the plurality of circulation channels are grouped together in groups of channels, the channels of a group running parallel to one another with a predetermined spacing between neighboring channels referred to as an intra-group spacing,
    two groups of channels that have the same direction of circulation of fluid being separated from one another by an intermediate group of channels that have an opposite direction of circulation of fluid;
    a connector assembled on the upper or lower plate, and configured to create a fluid path for connecting two outlet collecting zones, of the two groups of channels that have the same direction of circulation, these collecting zones being formed between the lower and upper plates,
    the connector comprising an external fluid inlet orifice and an external fluid outlet orifice,
    one of these two external orifices being in fluidic communication with the fluid path of the connector and the other of the external orifices being in fluidic communication with a fluid collecting zone which is situated on the intermediate group of channels that run between the two groups of channels which are connected to one another by the fluid path in the connector, the intermediate group of channels having a direction of circulation that is the opposite direction to the other two groups of channels,
    wherein the fluid path is formed by a slot made on a body of the connector and closed by a cover fixed in a fluidtight manner onto the body, this cover being of elongate shape,
    wherein the cover comprises a plate configured to be housed at least partially in the slot, the cover being welded to the body.

2. The device as claimed in claim 1, wherein the connector comprises two internal orifices onto which the fluid path of the connector opens, which path further communicates with one of the external orifices, these internal orifices being positioned respectively facing two holes in the upper or lower plate that open onto the associated collecting zones, and wherein the connector comprises a third internal orifice which communicates with the other of the external orifices via a channel in the connector, which channel is cylindrical in shape, this third internal orifice being positioned facing a third hole in the upper or lower plate which opens onto the collecting zone of the intermediate group of channels.

3. The device as claimed in claim 2, wherein the internal orifices are on the one same face of the connector, which face comes into contact with the upper or lower plate, and the external orifices are notably on an opposite face of the connector, notably so as to allow external pipes, one supplying and the other removing fluid, to be connected to these external orifices.

4. The device as claimed in claim 2, wherein the fluid path comprises a main portion perpendicular to the channel opening onto the third internal orifice, the main portion and the channel being separated from one another.

5. The device as claimed in claim 1, wherein the cover comprises a tab of rectangular shape housed in a cutout of a shape complementing the tab.

6. The device as claimed in claim 1, wherein the cover comprises two fixing lugs configured to come to bear against two lateral faces of the body.

7. The device as claimed in claim 1, wherein the body of the connector is made of aluminum, by casting and machining, and the cover is made of aluminum.

8. The device as claimed in claim 1, wherein the upper plate has three holes, two of the holes being associated with the two groups of channels with the same direction of circulation and an intermediate hole, between these two holes, which is associated with the intermediate group of fluid channels with the opposite direction, the three holes being aligned.

* * * * *